(12) United States Patent
Lee et al.

(10) Patent No.: US 11,855,136 B2
(45) Date of Patent: Dec. 26, 2023

(54) SUPER JUNCTION SEMICONDUCTOR DEVICE AND METHOD OF MANUFACTURING THE SAME

(71) Applicant: DB HITEK CO., LTD., Seoul (KR)

(72) Inventors: Ji Eun Lee, Seoul (KR); Jae Hyun Kim, Seoul (KR)

(73) Assignee: DB HITEK CO., LTD., Seoul (KR)

( * ) Notice: Subject to any disclaimer, the term of this patent is extended or adjusted under 35 U.S.C. 154(b) by 109 days.

(21) Appl. No.: 17/460,665

(22) Filed: Aug. 30, 2021

(65) Prior Publication Data

US 2022/0069075 A1 Mar. 3, 2022

(30) Foreign Application Priority Data

Aug. 31, 2020 (KR) .................. 10-2020-0109979

(51) Int. Cl.
*H01L 29/06* (2006.01)
*H01L 29/10* (2006.01)
*H01L 21/265* (2006.01)
*H01L 29/08* (2006.01)

(52) U.S. Cl.
CPC ........ *H01L 29/0634* (2013.01); *H01L 21/265* (2013.01); *H01L 29/0878* (2013.01); *H01L 29/1095* (2013.01)

(58) Field of Classification Search
CPC ............... H01L 21/265; H01L 29/0878; H01L 29/1095; H01L 29/402; H01L 29/66712; H01L 29/7804; H01L 29/7811; H01L 29/7803; H01L 29/7823; H01L 29/063–0634; H01L 29/0619–0623; H01L 29/66681–66704; H01L 29/7816–7826; H01L 29/0696
See application file for complete search history.

(56) References Cited

U.S. PATENT DOCUMENTS

| | | | | |
|---|---|---|---|---|
| 2006/0231917 | A1* | 10/2006 | Ono ..................... | H01L 29/0634 257/500 |
| 2016/0204192 | A1* | 7/2016 | Abiko ............... | H01L 21/76237 257/341 |
| 2019/0148485 | A1* | 5/2019 | Hamada .............. | H01L 29/0638 257/493 |

* cited by examiner

*Primary Examiner* — Cuong B Nguyen
(74) *Attorney, Agent, or Firm* — Patterson Thuente IP (57) ABSTRACT

A super junction semiconductor device includes a substrate of a first conductive type, an epitaxial layer disposed on the substrate, a plurality of pillars extending in a vertical direction and each being alternately arranged within the epitaxial layer, gate structures disposed on the epitaxial layer in the active region, a reverse recovery layer of a second conductive type, the reverse recovery layer disposed on both the pillars and the epitaxial layer and in the transition region to distribute a reverse recovery current, and at least one high concentration region surrounding an upper portion of at least one of the pillars in the peripheral region, the high concentration region having a horizontal width greater than that of one of the pillars provided in the transition region. Thus, a breakdown voltage may be inhibited from decreasing in the peripheral region.

10 Claims, 9 Drawing Sheets

SUPER JUNCTION SEMICONDUCTOR DEVICE AND METHOD OF MANUFACTURING THE SAME

CROSS-REFERENCE TO RELATED APPLICATION

This application claims priority and all the benefits accruing therefrom under 35 U.S.C. § 119 to Korean Patent Application No. 10-2020-0109979, filed on Aug. 31, 2020, the contents of which are incorporated by reference in their entirety.

TECHNICAL FIELD

The present disclosure relates to a super junction semiconductor device and a method of manufacturing the same, and more particularly, to a super junction semiconductor device including a metal oxide semiconductor field effect transistor (hereinafter, referred to as MOSFET) and a method of manufacturing the super junction semiconductor device.

BACKGROUND

Generally, a super junction semiconductor device having a super junction structure has been widely used in order to improve a trade-off relation between forward characteristics and reverse characteristics in a power semiconductor device.

A super junction semiconductor device generally includes a substrate defining an active region, a peripheral region surrounding the active region, and a transition region interposed between the active region and the peripheral region. Further, super junction semiconductors generally include a plurality of cells in the active region, each having a plurality of N-type pillars spaced apart from each other, a plurality of P-type pillars spaced apart from each other to be alternatively arranged, a P-body region and a plurality of gate structures, and a termination ring entirely surrounding an active region to define a peripheral region. Therefore, the super junction semiconductor device has a relatively low on-resistance $R_{sp}$ to decrease a size of the semiconductor device. As a result, the super junction semiconductor device has a reduced capacitance to improve the switching characteristics thereof.

However, in the conventional super junction semiconductor devices, a parasitic P-body diode is formed between the P-body region and the N-type pillar. When the P-body diode is switched from an on-state to an off-state, a reverse recovery phenomenon may occur. When the reverse recovery phenomenon occurs, minority carriers are removed in the P-body diode to generate a reverse recovery current $I_{sd}$. In this case, the reverse recovery (dt/di) may cause a relatively high voltage overshoot due to the stray capacitance. As a result, an increase in an amount of gate-drain charge and a current concentration may occur. In particular, the reverse recovery phenomenon may occur in a transition region between the active region and the peripheral region.

In order to suppress the reverse recovery phenomenon, a reverse recovery layer may be formed in the transition region to effectively dissipate the reverse recovery current.

However, the reverse recovery layer may have a problem of reducing the effective length of the N-type pillar.

Further, it is in the peripheral region that an electric potential may be required to be distributed in a horizontal direction as well as a vertical direction. In this case, a potential curvature may be decreased in the peripheral region to make a breakdown voltage (BV) of the peripheral region decrease. In particular, the breakdown voltage (BV) may seriously decrease due to charge imbalance N-rich situation.

Figure 1:
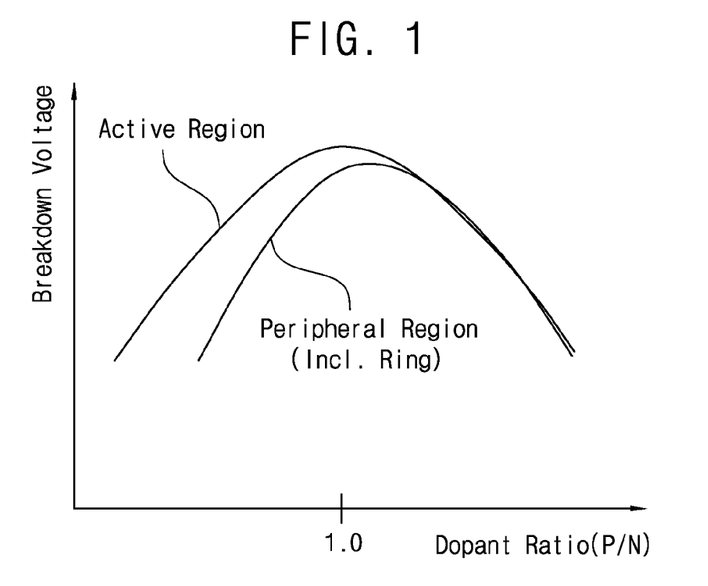
FIG. 1 is a graph showing a breakdown voltage according to a change of a dopant ratio (P/N ratio) in both the active region and the peripheral region of a conventional super junction semiconductor device.

FIG. 1 is a graph showing a breakdown voltage according to a change of a dopant ratio (P/N ratio) in both the active region and the peripheral region of a conventional super junction semiconductor device.

Referring to FIG. 1, the peripheral region corresponds relatively to a N-rich region, compared with the active region. In particular, a difference in the breakdown voltages between the active region and the peripheral region is large in the N-rich region. Accordingly, it may be required to reduce the difference in the breakdown voltages between the active region and the peripheral region.

Therefore, due to both a decrease in the effective pillar length of the N-type pillar in the transition region and a decrease in potential curvature in the peripheral region, a breakdown Voltage (BV) in the peripheral region may be severely reduced. As a result, since the difference between the breakdown voltage of the active region and that of the peripheral region becomes more severe, damage may occur in the peripheral region before the active region reaches to the breakdown voltage and processes the transient current.

SUMMARY

The example embodiments of the present disclosure provide a super junction semiconductor device capable of suppressing a breakdown voltage in a peripheral region from decreasing as well as distributing a reverse recovery current.

The example embodiments of the present disclosure provide a method of manufacturing a super junction semiconductor device capable of suppressing a breakdown voltage in a peripheral region from decreasing as well as distributing a reverse recovery current.

According to an example embodiment of the present disclosure, a super junction semiconductor device includes a substrate of a first conductive type, the substrate including an active region, a peripheral region surrounding the active region and a transition region interposed between the active region and the peripheral region, an epitaxial layer disposed on the substrate, the epitaxial layer having the first conductive type, a plurality of pillars spaced apart within the epitaxial layer, each pillar extending in a vertical direction and each being alternately arranged within the epitaxial layer, gate structures disposed on the epitaxial layer in the active region, and each extending across the epitaxial layer and the pillars in a horizontal direction, a reverse recovery layer of a second conductive type, the reverse recovery layer disposed on both the pillars and the epitaxial layer and in the transition region to distribute a reverse recovery current, and at least one high concentration region surrounding an upper portion of at least one of the pillars in the peripheral region (the corresponding pillar of the high concentration region), the high concentration region having a horizontal width greater than that of one of the pillars provided in the transition region or greater than the horizontal width of the corresponding pillar.

In an example embodiment, the high concentration region may have a horizontal width in a range of about 120 to 140% of the corresponding pillar.

In an example embodiment, the high concentration region may have a doping concentration higher than the corresponding pillar. Here, the high concentration region may have the doping concentration in a range of 200 to 800% of that of the corresponding pillar.

In an example embodiment, the high concentration region may be disposed adjacent to a boundary between the transition region and the peripheral region.

Here, each of high concentration regions may be disposed at an upper portion of each of three pillars counted from the boundary between the transition region and the peripheral region toward an end of the peripheral region.

In an example embodiment, each of the pillars in both the peripheral region and the transition region may have a vertical length greater than one of the pillars in the active region.

In an example embodiment, each of high concentration regions may surround the one of the pillars in a donut shape.

In an example embodiment, each of the pillars in both the peripheral region and the transition region may have a horizontal width greater than one of the pillars in the active region.

In an example embodiment, each of the gate structures may includes a gate insulating layer extending in the horizontal direction to cross the pillars, a gate electrode formed on the gate insulating layer, and a hard mask layer covering the gate electrode.

According to an example embodiment of the present disclosure, disclosed is a method of manufacturing a super junction semiconductor device. The method includes preparing a substrate of a first conductive type, the substrate including an active region, a peripheral region surrounding the active region and a transition region interposed between the active region and the peripheral region, forming an epitaxial layer of the first conductive type on the substrate, forming a plurality of pillars of a second conductive type, the pillars extending in a vertical direction, being formed inside of the epitaxial layer and being interleaved with the epitaxial layer in a horizontal direction, forming a reverse recovery layer in the transition region and on the epitaxial layer, the reverse recovery layer being configured to distribute a reverse recovery current, forming a high concentration region in the peripheral region and on the pillars, the high concentration region has the second conductive type, forming a field oxide layer on the epitaxial layer and the pillars in the peripheral region, and forming a gate structures on the epitaxial layer in the active region, the gate structure extending in the horizontal direction.

In an example embodiment, the high concentration region may have a horizontal width in a range of about 120 to 140% of the one of the pillars.

In an example embodiment, the high concentration region may be formed to have a doping concentration higher than the one of the pillars.

Here, the high concentration region may have the doping concentration in a range of 200 to 800% of that of the one of the pillars.

In an example embodiment, the high concentration region may be disposed adjacent to a boundary between the transition region and the peripheral region.

In an example embodiment, forming the pillars of the second conductive type may include forming each of the pillars in both the peripheral region and the transition region having a vertical length greater than one of the pillars in the active region.

In an example embodiment, forming the pillars of the second conductive type may be performed with a set of steps including an epitaxial growth process, a recess forming process and a recess filling process.

In an example embodiment, the high-concentration region may be formed to surround an upper portion of each of the pillars formed in the peripheral region.

In an example embodiment, the reverse recovery layer and the high concentration region may be formed through an ion implantation process.

Here, the reverse recovery layer and the high concentration region may be formed in situ.

According to example embodiments of the super junction semiconductor device and the method of manufacturing the super junction semiconductor device, the high concentration region is provided to surround the upper portion of at least one of the pillars in the peripheral region. The high concentration region includes the second conductivity type and the high concentration region having a horizontal width greater than that of the one of the pillar. Accordingly, as the high-concentration region is additionally formed in the peripheral region, the P/N dopant ratio P/N may increase to suppress the breakdown voltage in the peripheral region from decreasing.

In addition, when the super-junction semiconductor device operates, a boundary of a depletion region may expand in a radial direction from the peripheral region, so that a magnitude of an electric field in the horizontal direction is reduced. Accordingly, as the potential curvature is increased, the breakdown voltage may be suppressed from decreasing.

BRIEF DESCRIPTION OF THE DRAWINGS

Example embodiments can be understood in more detail from the following description taken in conjunction with the accompanying drawings, in which.

DETAILED DESCRIPTION OF EMBODIMENTS

Hereinafter, specific embodiments will be described in more detail with reference to the accompanying drawings. The present disclosure may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, regions, or plates may also be present. By contrast, it will also be understood that when a layer, a film, a region or a plate is referred to as being 'directly on' another one, it is directly on the other one, and one or more intervening layers, films, regions or plates do not exist. When a layer, a film, a region, or a plate is referred to as 'surrounding' another one, it is arranged such at that it entirely encompasses the other one in at least one two-dimensional plane. Also, though terms such as a first, a second, and a third are used to describe various components, compositions, regions, films, and layers in various embodiments of the present disclosure, such elements are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations. As used throughout the description and the claims, "above" and "below" refer to a device as oriented in the drawings. That is, "bottom" or "below" or "under" refers to the portions that are towards the bottom of the page and towards the unaltered substrate portion, whereas "top" or "over" or "above" refers to the portions that are towards the top of the page (that is, towards the portion of the structures that is operated upon with various treatments to form the electrically active components thereof). Such terms are used either on an absolute basis or relative to other components, and the meaning of such relative terminology will be understood in reference to the drawings.

In the following description, the technical terms are used only for explaining specific embodiments while not limiting the scope of the present disclosure. Unless otherwise defined herein, all the terms used herein, which include technical or scientific terms, may have the same meaning that is generally understood by those skilled in the art.

The depicted embodiments are described with reference to schematic diagrams of some embodiments of the present disclosure. Accordingly, changes in the shapes of the diagrams, for example, changes in manufacturing techniques and/or allowable errors, are sufficiently expected. The Figures are not necessarily drawn to scale. Accordingly, embodiments of the present disclosure are not described as being limited to specific shapes of areas described with diagrams and include deviations in the shapes and also the areas described with drawings are entirely schematic and their shapes do not represent accurate shapes and also do not limit the scope of the present disclosure.

Figure 2:
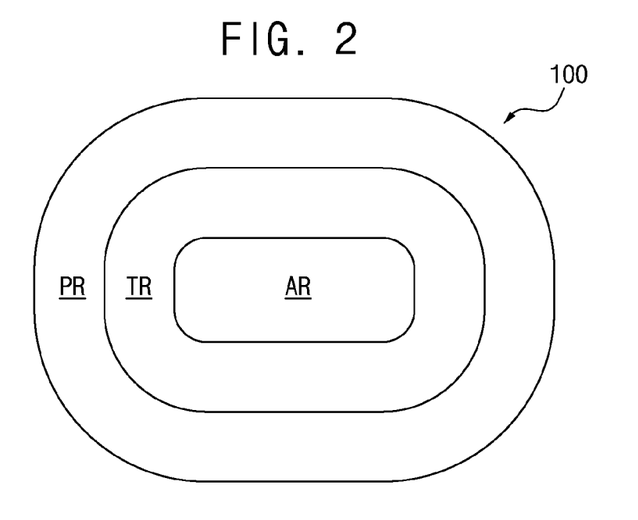
FIG. 2 is a plan view illustrating a super junction semiconductor device in accordance with an example embodiment of the present disclosure.
Figure 3:
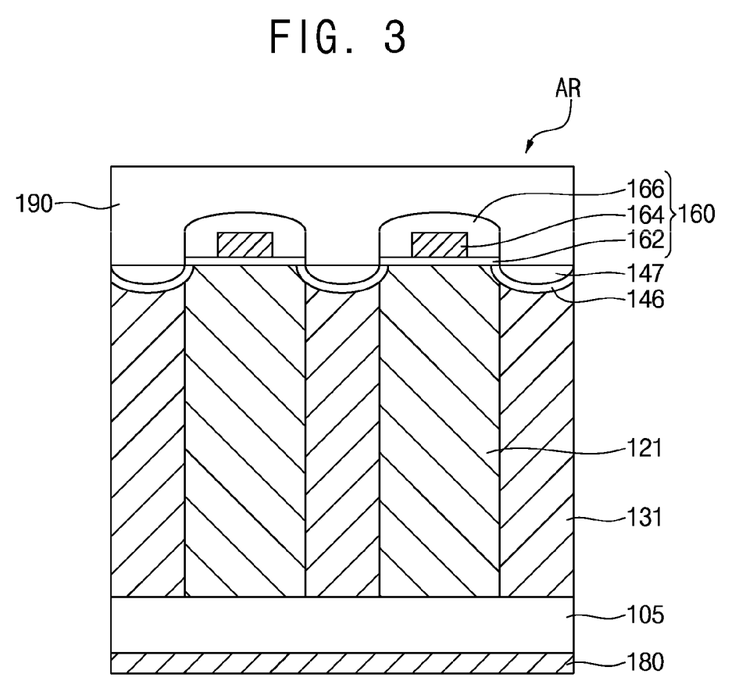
FIG. 3 is a cross sectional view illustrating a portion of an active region AR of the super junction semiconductor device of FIG. 2.
Figure 4:
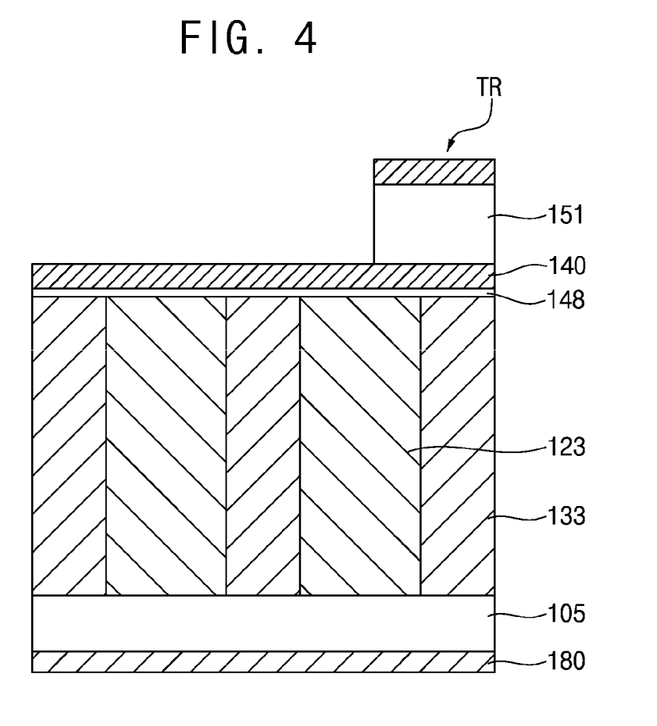
FIG. 4 is a cross sectional view illustrating a portion of a transition region TR of the super junction semiconductor device of FIG. 2.
Figure 5:
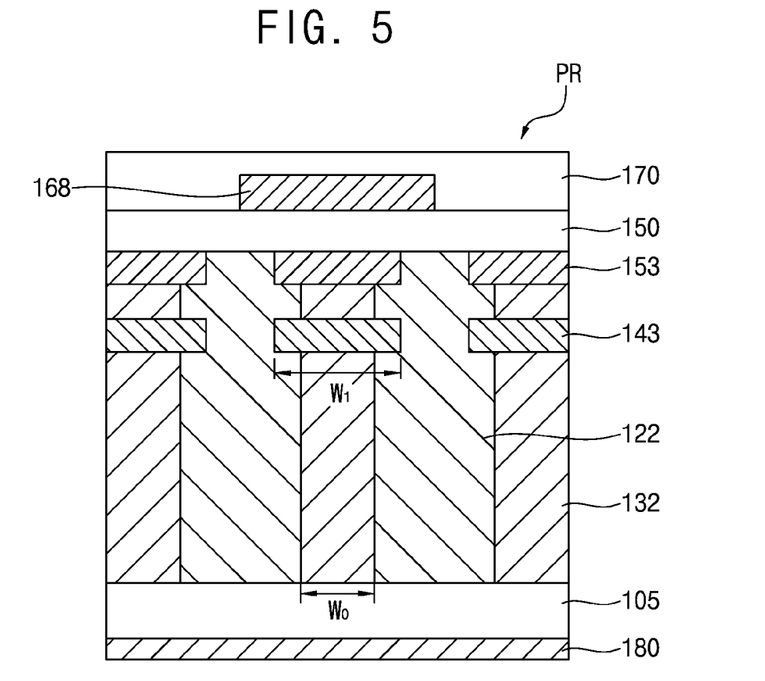
FIG. 5 is a cross sectional view illustrating a portion of a peripheral region PR of the super junction semiconductor device of FIG. 2.

FIG. 2 is a plan view illustrating a super junction semiconductor device in accordance with an example embodiment of the present disclosure. FIG. 3 is a cross sectional view illustrating a portion of an active region AR of the super junction semiconductor device of FIG. 2. FIG. 4 is a cross sectional view illustrating a portion of a transition region TR a portion of FIG. 2. FIG. 5 is a cross sectional view illustrating a portion of a peripheral region PR of the super junction semiconductor device of FIG. 2.

Referring to FIGS. 2 through 5, a super junction semiconductor device 100 in accordance with an example embodiment of the present disclosure includes a substrate 105, an epitaxial layer 120, a plurality of pillars 131, 132, and 133, a gate structure 160, a reverse recovery layer 140 and a high concentration layer 143.

The substrate 105 may include a silicon substrate. The substrate 105 has a first conductive type, for example, a high concentration conductive $N^+$ type.

The substrate 105 is divided into an active region AR, a peripheral region PR, and a transition region TR. The active region AR is disposed in a central portion of the semiconductor device. A power MOSFET is formed in the active region AR. The peripheral region PR is provided to surround the active region AR. Meanwhile, the transition region TR is defined as a boundary region between the active region AR and the peripheral region PR. Further, the transition region TR and the peripheral region PR are defined as a termination region.

The epitaxial layer 120 has the first conductive type, for example, a low concentration conductive N-type. The epitaxial layer 120 may be formed from the substrate 105 by an epitaxial growth process. The epitaxial layer 120 is formed over an entire upper portion of the substrate 105, such that epitaxial layer 120 comprises at least one active epitaxial region 121 in the active region AR, at least one peripheral epitaxial region 122 in the peripheral region PR, and at least one transition epitaxial region 123 in the transition region TR.

The pillars 131, 132 and 133 are formed entirely over the substrate 105 including the active region AR, the transition region TR, and the peripheral region PR. That is, the pillars 131, 132 and 133 include active pillars 131 provided in the active region AR, transition pillars 132 provided in the transition region TR, and peripheral pillars 133 provided in the peripheral region PR.

The pillars 131, 132 and 133 extend in a vertical direction inside the epitaxial regions 121, 122 and 123, respectively. The pillars 131, 132 and 133 may be formed to vertically penetrate the epitaxial regions 121, 122 and 123, respectively. The pillars 131, 132 and 133 may have a second conductivity type. That is, when each of the epitaxial regions 121, 122 and 123 has an n-type conductivity, each of the pillars 131, 132 and 133 may have a p-type conductivity.

Alternatively, the epitaxial regions 121, 122 and 123 interposed between the pillars 131, 132 and 133 having the second conductivity type may function as the pillars of the first conductivity type.

Also, when viewed in a plan view, each of the pillars 131, 132 and 133 may have a stripe shape. Alternatively, each of the pillars 131, 132 and 133 may have a polygonal shape such as a hexagonal shape.

Also, the pillars 131, 132 and 133 may be alternately arranged in a horizontal direction. That is, the pillars 131, 132 and 133 are arranged to be spaced apart from each other in the horizontal direction. Accordingly, each of the pillars 131, 132, and 133 and the epitaxial regions 121, 122, and 123 may be alternately arranged with one another.

Referring to FIG. 3 again, a P-body region 146 is provided at an upper portion of the active pillars 131. In addition, a high concentration region 147 of the second conductivity type is provided in the upper portion of the P-body region 146. Accordingly, since the P-body region 146 and the high concentration region 147 have relatively low resistance, an electrical connection between the active pillars 131 and the source electrode 190 may be stably secured.

The gate structure 160 is provided on the active epitaxial region 121 in the active region AR. The gate structure 160 formed in the active region extends in a horizontal direction across one of the active epitaxial regions 121. The gate structure 160 may have a stripe shape. When a plurality of gate structures 160 is provided, the gate structures 160 are arranged to be spaced apart from each other.

Meanwhile, in a plan view, when each of the active epitaxial regions 121 has a hexagonal shape, the gate structure 160 can extend between active epitaxial regions 121 that are adjacent to each other.

Since the gate structure 160 has a stripe shape, a width of the gate structure 160 is relatively narrow, so that the super-junction semiconductor device 100 may have reduced input capacitance.

The gate structure 160 formed in the active region includes a gate insulating layer 162, a gate electrode 164, and a hard mask layer 166.

The gate insulating layer 162 is provided to extend across the active epitaxial regions 121. An example of the gate insulating layer 162 may include a silicon oxide layer.

The gate electrode 164 is positioned on the gate insulating layer 162. A width of the gate electrode 164 may be narrower than the width of the gate insulating layer 162. An example of the gate electrode 164 may include polysilicon material.

The hard mask layer 166 is provided to cover the gate electrode 164 and the gate insulating layer 162. The hard mask layer 166 electrically insulates the gate electrode 164 and the source electrode 190 from each other. An example of the hard mask layer 166 includes a nitride layer.

Although not shown, the gate structure 160 may have a trench structure. In this case, the gate structure 160 is formed to extend into each of the active epitaxial regions 121. Since a gap between the active pillars 131 may be reduced, forward characteristics may be improved according to the improvement in the degree of integration of the super-junction semiconductor device 100.

Referring to FIG. 4 the reverse recovery layer 140 is located in the transition region TR. The reverse recovery layer 140 is provided to distribute a reverse recovery current.

That is, when the super junction semiconductor device 100 is switched from an on-state to an off-state, a reverse recovery phenomenon may occur. In particular, the reverse recovery phenomenon can be severe at the transition region TR. When a reverse recovery current $I_{sd}$ is concentrated in a boundary region between the transition region TR and the peripheral region PR, the reverse recovery current $I_{sd}$ may flow along the reverse recovery layer 140 to reduce a resistance value of the reverse recovery current bd. Thus, the reverse recovery layer 140 may suppress the lattice temperature from increasing. As a result, a burnt phenomenon around the boundary region may be suppressed.

The reverse recovery layer 140 is formed on the transition pillars 133 and on the transition epitaxial regions 123. The reverse recovery layer 140 may have a second conductivity type, for example, a P-type conductivity. The reverse recovery layer 140 may be formed by ion implantation of an impurity element such as a group III element, for example, boron, gallium, or indium. In this case, in the ion implantation process, the reverse recovery layer 140 may be adjusted to have various profiles by changing a processing time, an ion implantation amount, or ion implantation energy conditions.

A diffusion region 148 may be additionally provided in the transition region TR and over the transition pillar 133. A horizontal end portion of the diffusion region 148 may be bridged to the first active pillar 131 of the active region AR. Accordingly, the diffusion region 148 may connect the transition pillars 133 in the transition region TR to one of the active pillars 131 provided in the active region AR. As a result, the transition pillar 133 may be connected to the source electrode 190 via the diffusion region 148 and the active pillar 131.

The diffusion region 148 in the transition region TR may have a doping concentration similar to that of the P-body region 146 in the active region. The diffusion region 148 in the transition region TR may have the second conductivity type as the P-body region 146 in the active region has.

Meanwhile, the reverse recovery layer 140 may have the ion concentration higher than that of the diffusion region 148. Accordingly, when the reverse recovery current Isd flows, the reverse recovery layer 140 formed in the transition region TR may effectively makes a resistance of the reverse recovery current lower.

A portion of a field oxide layer 151 is further disposed at a boundary of between the transition region TR and the peripheral region PR.

Referring back to FIG. 5, the high concentration region 143 is formed in the peripheral region PR. The high concentration region 143 is provided to surround an upper end portion of at least one of the peripheral pillars 132. The high concentration region 143 has the second conductivity type. For example, the high concentration region 143 may have the P-type conductivity type. The high concentration region 143 has a horizontal width Wi greater than a horizontal width Wo of one of the peripheral pillars 132.

Further, it is in the peripheral region PR that a field oxide layer 150 is formed directly on the peripheral pillars 132 and the peripheral epitaxial regions 122, in contrast to the active region AR and the transition region TR.

Since the field oxide layer 150 may serve as a mask for sequentially performing an ion-implanting process of forming the reverse recovery layer 140 of the P-type conductivity, the dopants may be difficult to implant the peripheral pillars 132 and the peripheral epitaxial regions 122. Thus, the peripheral region PR may have a relatively wider N-rich region compared to the active region AR and the transition region TR.

Accordingly, as the high concentration region 143 is additionally formed in the peripheral region PR, a P/N dopant ratio may increase to suppress the breakdown voltage from decreasing in the peripheral region PR.

That is, when the super-junction semiconductor device operates, a boundary of a depletion region may expand along a radial direction from the peripheral region PR, so that a magnitude of an electric field in a horizontal direction is reduced. Accordingly, as the potential curvature may increase at the peripheral region, the breakdown voltage may be inhibited from decreasing.

In an example embodiment of the present disclosure, the high concentration region 143 may have the horizontal width Wi in the range of 120% to 140% greater than the horizontal width Wo of one or all of the pillars in the peripheral region.

The field oxide layer 150 is provided in the peripheral region PR. That is, the field oxide layer 150 may define a peripheral region PR. The field oxide layer 150 may oxidize the epitaxial layer 120 to electrically isolate the active region AR from the peripheral region PR.

A field plate electrode 168 is formed on the field oxide layer 150. The field plate electrode 168 may electrically have a floating state. Accordingly, the field plate electrode 168 is also referred to as a dummy electrode.

The field plate electrode 168 may be made of, for example, a polysilicon material. Further, a surface passivation layer 170 covering the field plate electrode 168 is formed.

Meanwhile, as described above, the peripheral epitaxial regions 122 and the peripheral pillars 132 extend in the vertical direction in the peripheral region PR. In addition, the peripheral epitaxial regions 122 and the peripheral pillars 132 may be alternately arranged.

As the field plate electrode 168 is provided in the peripheral region PR, the super-junction semiconductor device 100 may have improved withstand voltage characteristics by reducing an electric field concentration and further increasing the breakdown voltage.

In an example embodiment of the present disclosure, the high concentration region 143 may have a doping concentration higher than that of the peripheral pillars 132 provided in the peripheral region PR. In this case, the high concentration region 143 may have a doping concentration in a range of 200% to 800% of that of the peripheral pillars 132 in the peripheral region PR.

In an example embodiment of the present disclosure, a P-top region 153 (see FIG. 5) is further provided at an uppermost end of one of the peripheral pillars 132 in the peripheral region PR. The P-top region 153 may prevent either the semiconductor device from damaging or the breakdown voltage thereof from decreasing. In this case, the P-top region 153 may be formed on the uppermost end of each of the peripheral pillars 132 through an ion implantation process using dopants of a group III element such as boron.

Referring back to FIGS. 2 and 3, the source electrode 190 is provided to cover the gate structures 160 on the epitaxial regions 121. Meanwhile, the drain electrode 180 is formed on the lower surface of the substrate 110.

Figure 6:
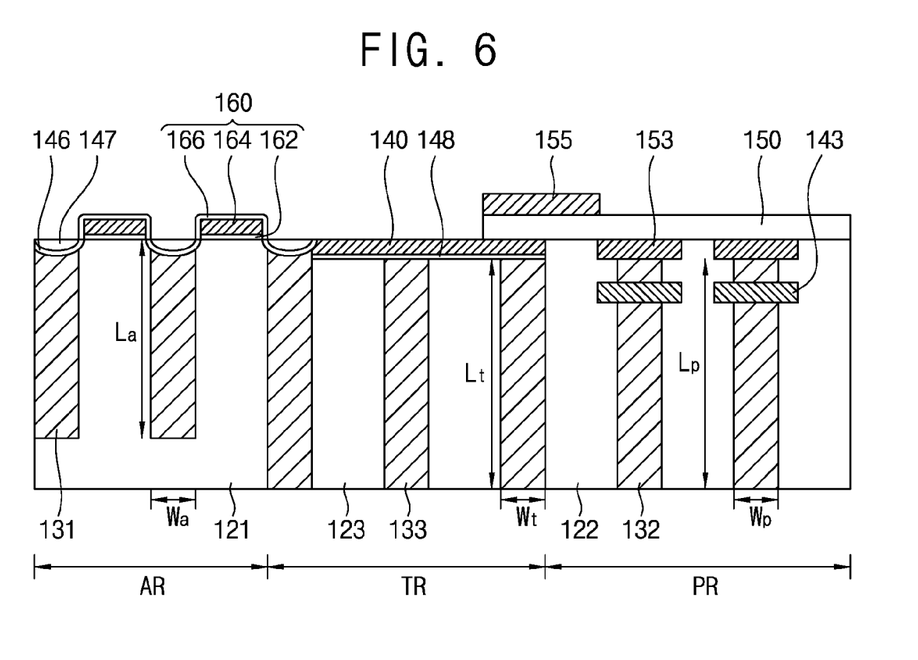
FIG. 6 is a plan view illustrating a super junction semiconductor device in accordance with an example embodiment of the present disclosure.

FIG. 6 is a plan view illustrating a super junction semiconductor device in accordance with an example embodiment of the present disclosure.

As discussed with respect to FIGS. 2 through 5, the super-junction semiconductor device 100 in accordance to an example embodiment of the present disclosure includes a substrate 105, epitaxial regions 121, 122, 123, and pillars 131, 132, and 133, gate structures 160, a reverse recovery layer 140, and a high concentration region 143.

The substrate (not shown in FIG. 6) includes an active region AR, a peripheral region PR, and a transition region TR. The peripheral area PR is provided to surround the active area AR. Meanwhile, the transition region TR is defined as a boundary region between the active region AR and the peripheral region PR. In this case, it is defined as a termination region (ring region) including the transition region TR and the peripheral region PR.

The high concentration region 143 is formed in the peripheral region PR. The high concentration region 143 is provided to surround an upper end portion of at least one of the peripheral pillars 132. The high concentration region 143 has the second conductivity type. For example, the high concentration region 143 has a P-type conductivity type. The high concentration region 143 has a horizontal width greater than that of each of the peripheral pillars 132. Accordingly, when the super-junction semiconductor device operates, a boundary of a depletion region may expand along a radial direction from the peripheral region PR, so that the magnitude of an electric field in a horizontal direction is reduced. Therefore, by increasing the potential curvature, a decrease in the breakdown voltage in the N-rich region within the termination region can be suppressed.

In addition, the peripheral pillars 132 formed in the peripheral area PR and the transition pillars 133 formed in the transition area TR, respectively, have vertical lengths $L_p$, $L_t$ longer than a vertical length $L_a$ of the active pillars 131 formed in the active area AR. That is, the pillars 132 and 133 formed in the termination region may have vertical lengths greater than those of the pillars 131 formed in the active region AR. Thus, the breakdown voltage may increase in the P-rich region among the termination regions.

Furthermore, the peripheral pillars 132 formed in the peripheral area PR and the transition pillars 133 formed in the transition area TR, respectively, have horizontal widths $W_p$, and $W_t$ greater than the horizontal width $W_a$ of each of the active pillars 131 formed in the active area AR. Accordingly, a dopant balance between the N-rich region and the P-rich region within the termination region may be controlled.

FIGS. 7 to 12 are cross sectional views illustrating a method of manufacturing a super junction semiconductor device in accordance with an example embodiment of the present disclosure.

Figure 7:
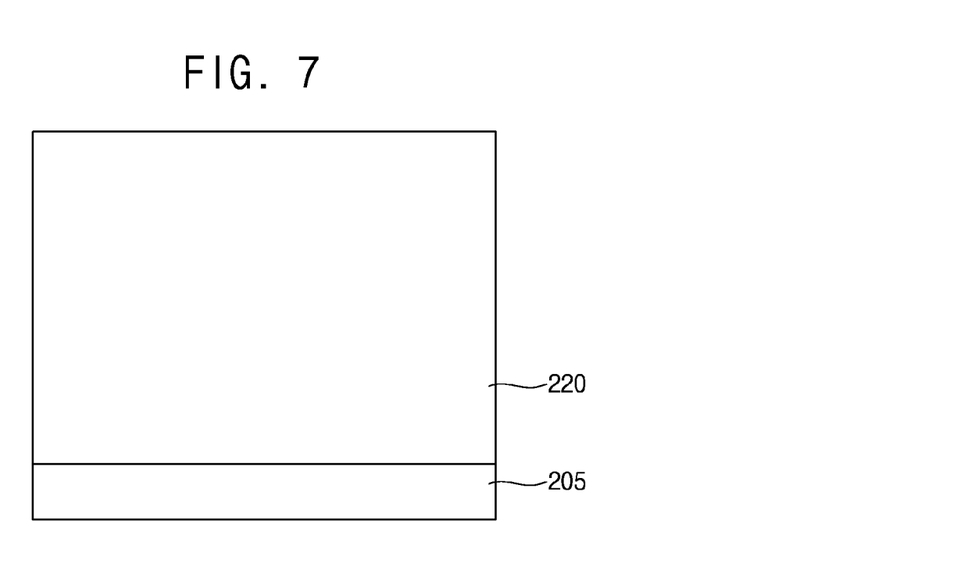
FIGS. 7 to 12 are cross sectional views illustrating a method of manufacturing a super junction semiconductor device in accordance with an example embodiment of the present disclosure.

Referring to FIG. 7, an epitaxial layer 220 of a first conductivity type is formed on a substrate 205 of the first conductivity type. The epitaxial layer 220 is formed through an epitaxial process on the first conductivity-typed substrate 205.

Figure 8:
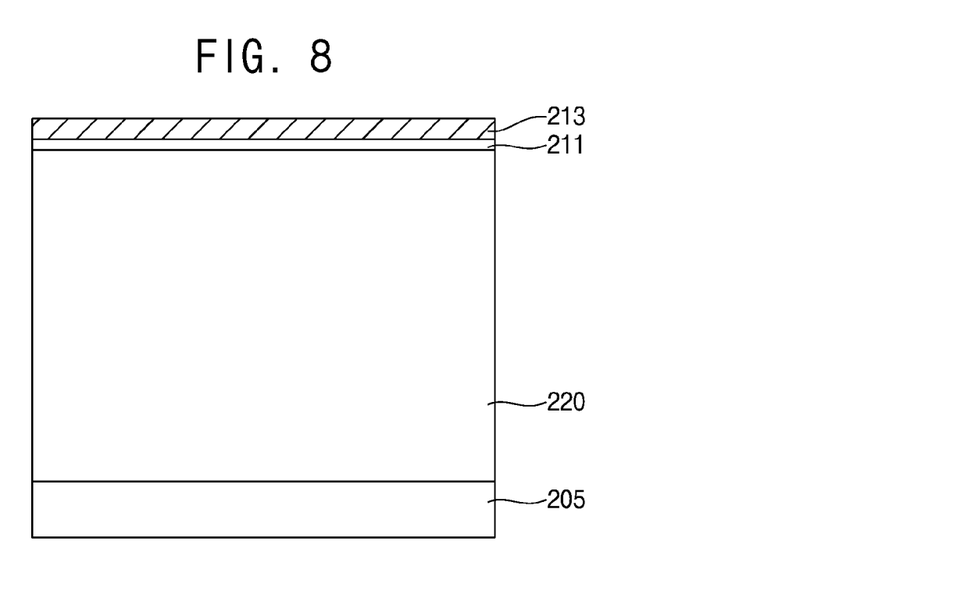

Referring to FIG. 8, a buffer oxide layer 211 is formed on the epitaxial layer 220. Subsequently, a polysilicon layer 213 is formed on the buffer oxide layer 211. In this case, the buffer oxide layer 211 may protect the upper portion of the epitaxial layer 220 in a subsequent process of forming the polysilicon layer.

Figure 9A:
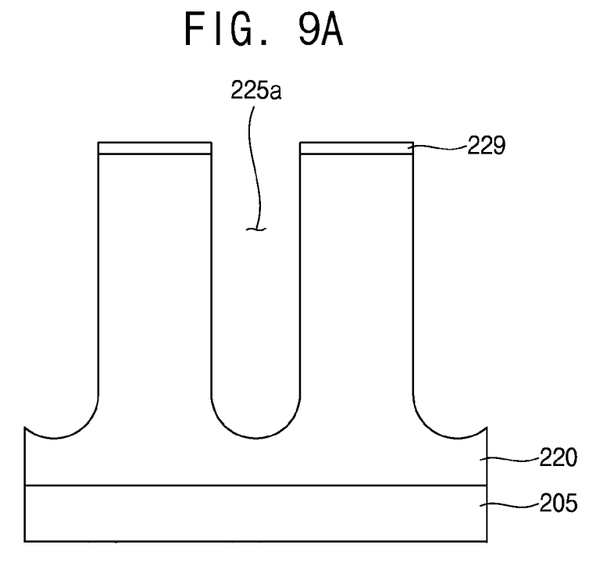

Referring to FIG. 9A, the polysilicon layer 213 and the buffer oxide layer 211 formed on the upper surface of the substrate 205 are removed from the substrate 205. For this purpose, a chemical mechanical polishing process is performed.

Then, trenches 225a vertically recessing the inside of the epitaxial layer 220 are formed. In this case, a silicon etching process using a conventional etching mask 229 may be performed to form the trenches 225a.

Figure 9B:
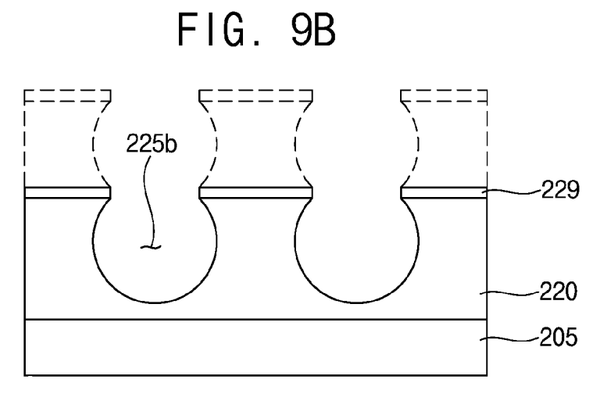

Referring to FIG. 9B, a set of steps of forming a sub-epitaxial layer 220 and a sub-trench 225b, and filling the sub-trench 225b with the epitaxial silicon is performed as one cycle to form sub-pillars (not shown). By performing the cycle a plurality of times, a plurality of sub-pillars may be vertically stacked to form a pillar. In this case, the pillars formed in the transition region and the peripheral region may be formed to have heights, respectively, than that of each of the pillars formed in the active region.

Figure 10:
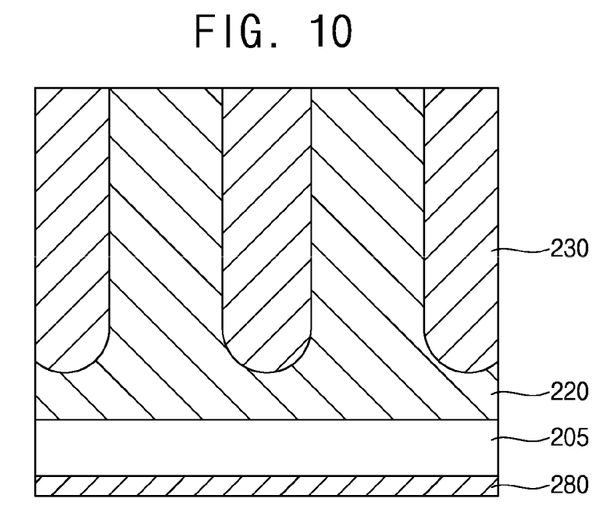

Referring to FIG. 10, the trenches 225 are filled with epitaxial silicon material, and a post-baking process is further performed. Then, it is performed to planarize the silicon layer surface. Accordingly, pillars 230 are formed in the trenches 225a. The pillars 230 may be formed to have a second conductivity type.

Figure 11:
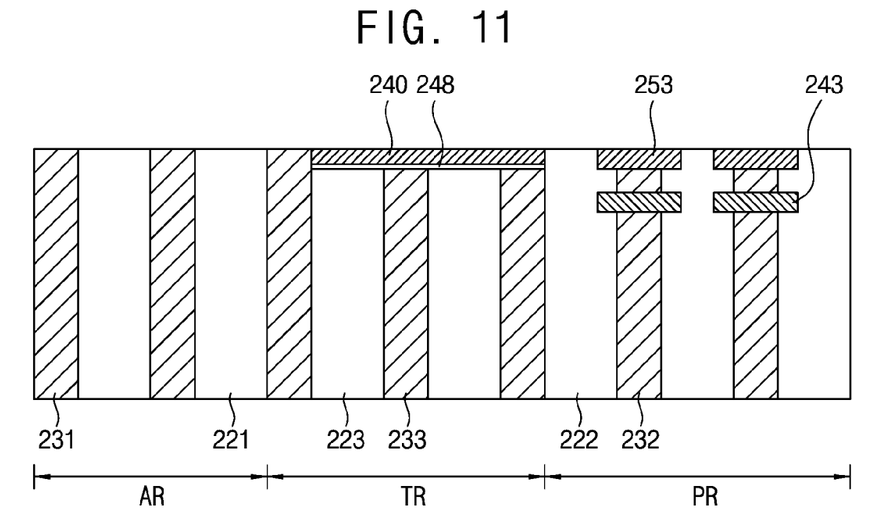

Referring to FIG. 11, an ion implantation process is performed to form a reverse recovery layer 240 in the transition layer TR.

Further, a high concentration region 243 is formed to surround the pillars 232 in the peripheral region PR. The high concentration region 243 may have a horizontal width $W_p$ greater than that of one of the peripheral pillars 232.

In an example embodiment of the present disclosure, the high concentration region 243 may be formed to have the horizontal width in a range of 120% to 140% greater than those of the peripheral pillars 233 in the peripheral region.

In an example embodiment of the present disclosure, the high concentration region 243 may be formed in the peripheral region PR, having a doping concentration higher than that of one of the peripheral pillars 233. The high concentration region 243 may has the doping concentration in a range of 200% to 800% of that of one of the peripheral pillars 233.

In an example embodiment, the high concentration region 243 may be formed adjacent to a boundary between the transition region TR and the peripheral region PR.

Meanwhile, the reverse recovery layer 240 and the high concentration region 243 may be formed in situ.

In an example embodiment of the present disclosure, a P-top region 253 is further provided at an uppermost end of one of the peripheral pillars 232 in the peripheral region PR. The P-top region 253 may prevent either the semiconductor device from damaging or the breakdown voltage thereof from decreasing. In this case, the P-top region (not shown) may be formed on the uppermost end of each of the peripheral pillars 232 through an ion implantation process using dopants of a group III element such as boron.

Figure 12:
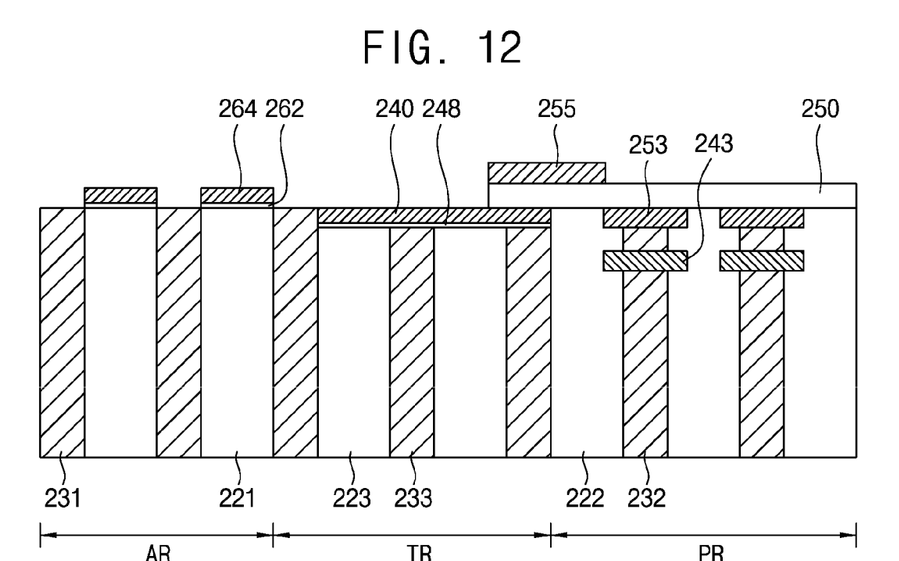

Referring to FIG. 12, a gate oxide layer 262 and a gate electrode 264 made of gate polysilicon are formed using known techniques.

A first ion implantation process is performed using the gate structure (refer to FIG. 3) formed in the active region AR as an ion implantation mask. Thereafter, the P-body region 146 (refer to FIG. 3) is formed in the active region AR through a relatively high temperature annealing process like a diffusion process.

Thereafter, a field oxide layer 250 is formed in the peripheral region PR. The field oxide layer 250 may be formed through an oxidation process of oxidizing upper portions of the peripheral pillars 232 and the epitaxial layer 222 formed in the peripheral region PR.

Thereafter, an insulating interlayer (not shown) is further formed through a deposition process and a reflow process. Thereafter, the insulating interlayer and the gate oxide layer are patterned to form contact openings (not shown) exposing the high concentration region.

Then, a metal layer filling the contact openings is formed to form a source electrode (not shown). The source electrode may be connected to the active pillars 231 through the P-body region 146 (refer to FIG. 3).

As described above, according to example embodiments of the super junction semiconductor device and the method for manufacturing the same according to the present disclosure, the reverse recovery current is effectively distributed to suppress the breakdown voltage in the peripheral region from decreasing as well.

Although the super junction semiconductor device has been described with reference to the specific embodiments, they are not limited thereto. Therefore, it will be readily understood by those skilled in the art that various modifications and changes can be made thereto without departing from the spirit and scope of the appended claims.

What is claimed is:

1. A super junction semiconductor device comprising:
a substrate of a first conductive type, the substrate including an active region, a peripheral region surrounding the active region and a transition region interposed between the active region and the peripheral region;
an epitaxial layer disposed on the substrate, the epitaxial layer having the first conductive type, the epitaxial layer including an active epitaxial region formed in the active region, a peripheral epitaxial region formed in the peripheral region and a transition epitaxial region formed in the transition region;
a plurality of pillars spaced apart within the epitaxial layer, each pillar extending in a vertical direction, the plurality of pillars including active pillars formed in the active region, peripheral pillars formed in the peripheral region and transition pillars formed in the transition region;
a plurality of gate structures disposed on the active epitaxial region, each gate structure extending across the active epitaxial region in a horizontal direction;
a reverse recovery layer of a second conductive type, the reverse recovery layer disposed on both the transition pillars and the transition epitaxial region to distribute a reverse recovery current; and
at least one high concentration region, the high concentration region surrounding an upper portion of a corresponding pillar, the corresponding pillar selected from one of the peripheral pillars and the high concentration region having a horizontal width greater than that of the corresponding pillar,
wherein each of a plurality of high concentration regions surrounds each of the peripheral pillars, respectively.

2. The super junction semiconductor device of claim 1, wherein the high concentration region has a horizontal width in a range of about 120% to 140% of the horizontal width of the corresponding pillar.

3. The super junction semiconductor device of claim 1, wherein the high concentration region has a doping concentration higher than a doping concentration of the corresponding pillar.

4. The super junction semiconductor device of claim 3, wherein the high concentration region has a doping concentration in a range of 200 to 800% of the doping concentration of the corresponding pillar.

5. The super junction semiconductor device of claim 1, wherein each high concentration region is disposed adjacent to a boundary between the transition region and the peripheral region.

6. The super junction semiconductor device of claim 5, wherein each of high concentration regions corresponds to a separate one of three pillars counted from the boundary between the transition region and the peripheral region toward an end of the peripheral region.

7. The super junction semiconductor device of claim 1, wherein each of the peripheral and transition pillars has a vertical length greater than a vertical length of at least one of the active pillars.

8. The super junction semiconductor device of claim 1, wherein the high concentration region has a donut shape.

9. The super junction semiconductor device of claim 1, wherein each of the peripheral and transition pillars has a horizontal width greater than a horizontal width of at least one of the active pillars.

10. The super junction semiconductor device of claim 1, wherein each of the gate structures comprises:
a gate insulating layer extending in the horizontal direction to cross the active pillars;
a gate electrode formed on the gate insulating layer; and
a hard mask layer covering the gate electrode.

* * * * *